(12) United States Patent
Kameyama et al.

(10) Patent No.: US 7,716,021 B2
(45) Date of Patent: May 11, 2010

(54) GRID TRANSPARENCY AND GRID HOLE PATTERN CONTROL FOR ION BEAM UNIFORMITY

(75) Inventors: Ikuya Kameyama, Fort Collins, CO (US); Daniel E. Siegfried, Fort Collins, CO (US)

(73) Assignee: Veeco Instruments, Inc., Woodbury, NY (US)

( * ) Notice: Subject to any disclaimer, the term of this patent is extended or adjusted under 35 U.S.C. 154(b) by 798 days.

(21) Appl. No.: 11/395,354

(22) Filed: Mar. 31, 2006

(65) Prior Publication Data

US 2006/0253510 A1 Nov. 9, 2006

Related U.S. Application Data

(60) Provisional application No. 60/677,386, filed on Mar. 31, 2005.

(51) Int. Cl.
G06F 17/50 (2006.01)

(52) U.S. Cl. .................... 703/2; 703/7; 716/21; 355/67

(58) Field of Classification Search .................... 703/2, 703/6, 7; 250/396 ML; 716/21; 355/67
See application file for complete search history.

(56) References Cited

U.S. PATENT DOCUMENTS 4,873,467 A 10/1989 Kaufman et al.

| | | | |
|---|---|---|---|
| 5,551,904 A | 9/1996 | Hedges et al. | |
| 5,559,391 A | 9/1996 | Valentian | |
| 6,630,681 B1 | 10/2003 | Kojima | |
| 6,849,858 B2 | 2/2005 | Okazaki et al. | |
| 7,183,716 B2 | 2/2007 | Kanarov et al. | |
| 2004/0212288 A1 | 10/2004 | Kanarov et al. | |
| 2006/0256311 A1* | 11/2006 | Hansen et al. | 355/67 |

OTHER PUBLICATIONS

International Search Report prepared by the U.S. Patent and Trademark Office as Searching Authority for international patent application No. PCT/US2006/012019, Dec. 18, 2007, 2 pages.
Written Opinion prepared by the U.S. Patent and Trademark Office as Searching Authority for international patent application No. PCT/US2006/012019, Dec. 18, 2007, 4 pages.

* cited by examiner

*Primary Examiner*—Thai Phan
(74) *Attorney, Agent, or Firm*—Hensley Kim & Holzer, LLC

(57) ABSTRACT

A design process for varying hole locations or sizes or both in an ion beam grid includes identifying a control grid to be modified; obtaining a change factor for the grid pattern; and using the change factor to generate a new grid pattern. The change factor is one or both of a hole location change factor or a hole diameter change factor. Also included is an ion beam grid having the characteristic of hole locations or sizes or both defined by a change factor modification of control grid hole locations or sizes or both.

30 Claims, 10 Drawing Sheets

Flow chart depiction of design process using a grid transparency change ratio

Figure 3 Transparency profiles of a conventional grid pattern design.

Figure 4  Radial stretching of grid pattern

Figure 5  Linear stretching of grid pattern.

Figure 7  Original discrete zoned design

Figure 8   Modified continuously spaced design

Figure 9

Figure 10  Flow chart depiction of design process using two grid transparencies

Figure 11 Flow chart depiction of design process using a grid transparency change ratio

US 7,716,021 B2

GRID TRANSPARENCY AND GRID HOLE PATTERN CONTROL FOR ION BEAM UNIFORMITY

RELATED APPLICATIONS

This application claims benefit of U.S. Provisional Application No. 60/677,386; entitled "GRID TRANSPARENCY AND GRID HOLE PATTERN CONTROL FOR ION BEAM UNIFORMITY" and filed Mar. 31, 2005, incorporated herein by reference for all that it discloses and teaches.

TECHNICAL FIELD

The described subject matter relates to a technique of ion source grid hole pattern design and control of grid transparency using stretching and/or shrinking of distances between grid holes, typically radially or linearly, where the grids are typically the electrodes of a broad beam ion acceleration system.

BACKGROUND

One of the issues in the development and usage of broad beam ion sources is in the production of very uniform ion beam density profiles. Since electric discharge plasmas do not themselves have a uniform distribution of ion density, ion sources which utilize ions generated in the plasma typically have non-uniform ion beam density profiles. Though the discussion here references beam grids, for example for ion sources, it applies generally to any charged particle broad beam source including both positive and negative ion beam sources and electron sources.

In order to solve this problem and achieve higher uniformities of ion beam current densities, ion extraction grids of gridded ion sources have been developed with variations of grid open area fraction (grid transparency) over the entire grid pattern. Indeed many have discrete sections of grid patterns in each of which may be different hole-to-hole distances and/or different hole diameters. Such ion extraction grids have been provided as solutions for various applications. At higher requirements of ion beam current density uniformities, however, the boundaries of such discrete sections may still cause unwanted disturbances in ion beam current density uniformities.

Figure 1:
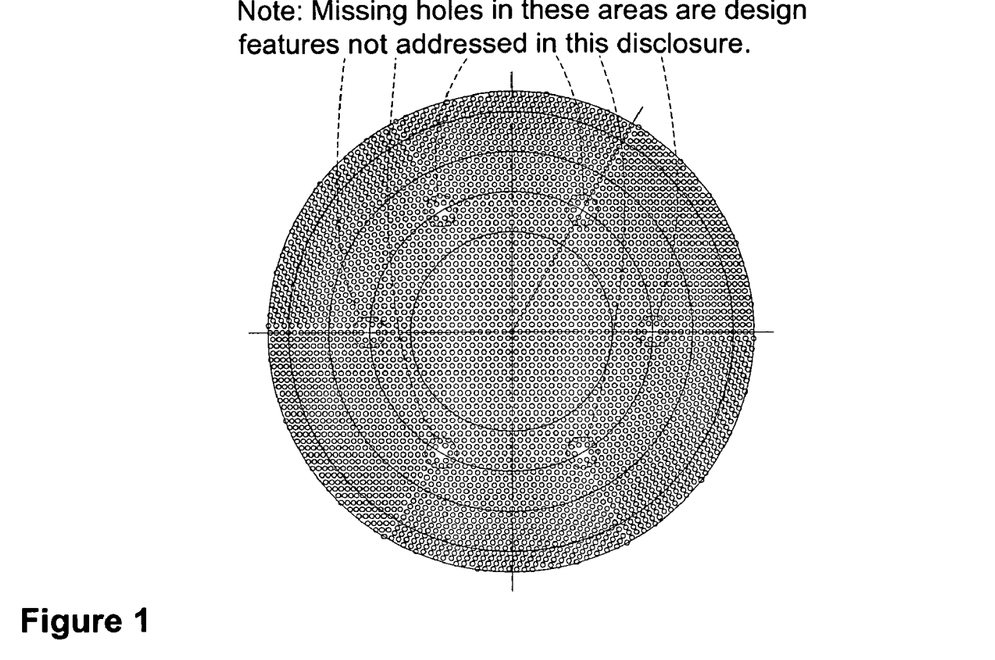
FIG. 1 is a schematic plan view of a conventional ion beam grid pattern.
Figure 2:
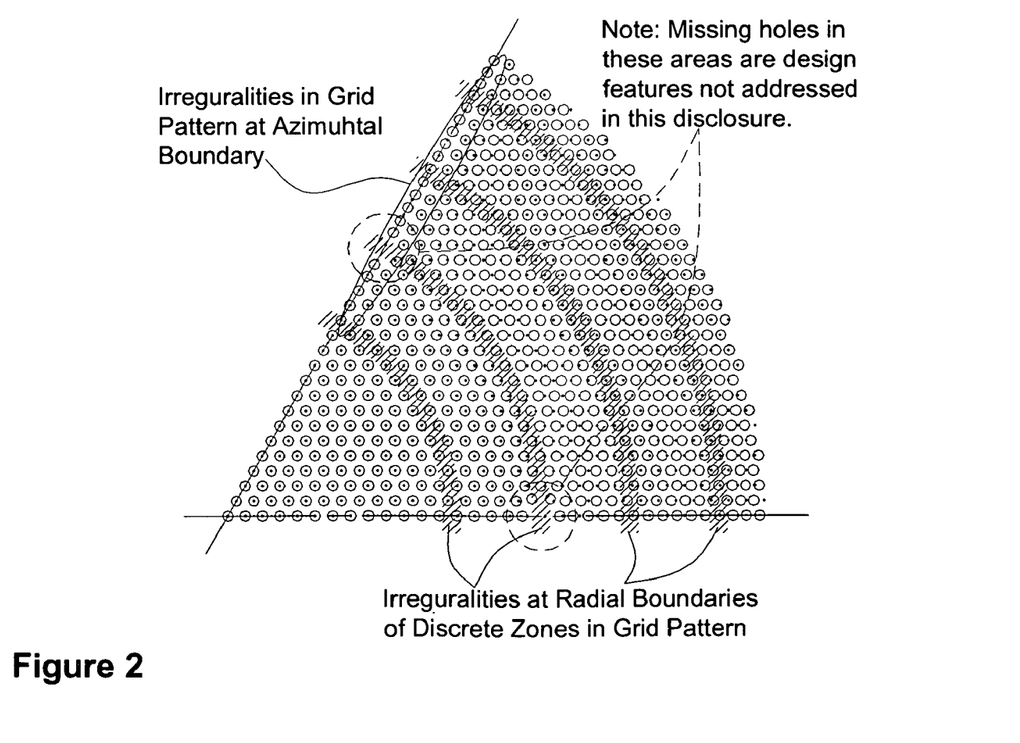
FIG. 2 is an enlarged portion of the schematic grid pattern of FIG. 1.
Figure 3:
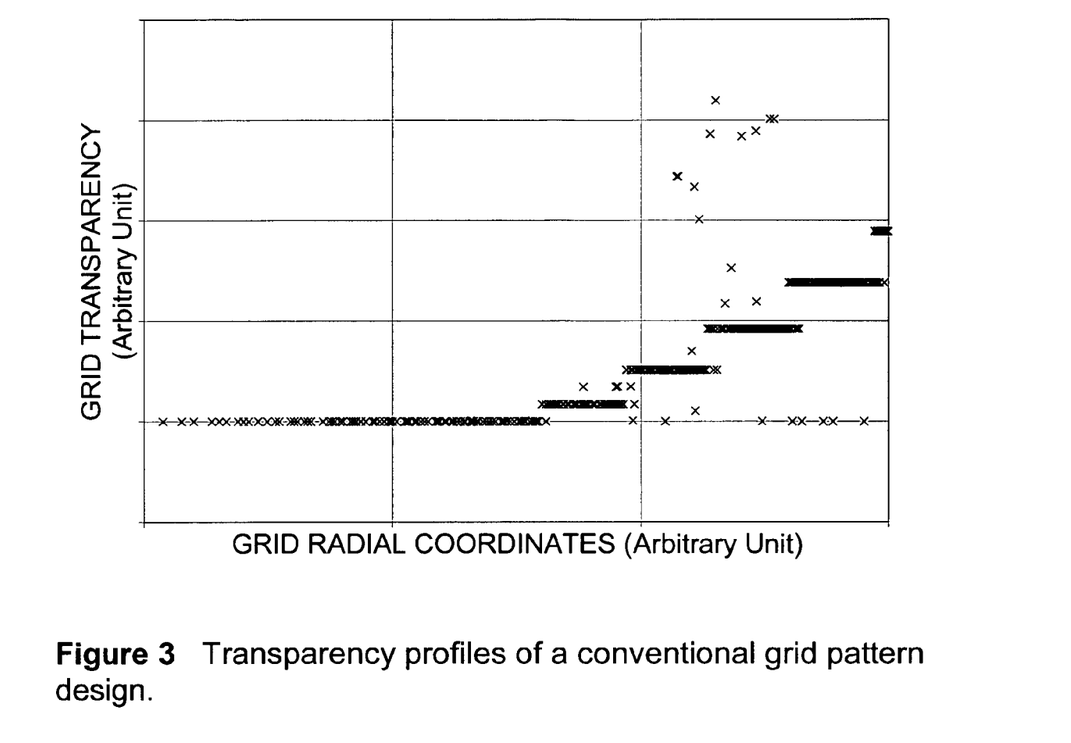
FIG. 3 is a plot of the distribution of transparency of another conventional grid pattern.

FIG. 1 shows one example of an arbitrary conventional grid pattern which has multiple discrete radially defined zones for grid transparency (the concentric circles being indicative of, and demarcating the boundaries between zones). Within each zone, the grid design is typically filled with repeating patterns to obtain a constant grid transparency within that zone. At the boundaries of zones, however, the transition between one zone and another may not be smooth, resulting in local discontinuities in the grid hole density, and, if left uncorrected, in the beam current density. FIG. 2 shows typical irregularities at both radial and azimuthal zone boundaries (note, the small black circles show locations of holes if they were equally spaced). These zone boundaries may be radial and various azimuthal boundaries may appear as shown here or, depending on the particular design, there may be other boundaries where either the hole size or spacing changes discontinuously. (Note, the six areas unpopulated with holes that are observed at the second radial boundary from the center in FIG. 1 are a result of other design features not relevant to the subject of this disclosure.) Conventionally, any adjustment to smooth the transition at the boundaries has been done by design personnel on a hole-by-hole basis. Shown in FIG. 3 is a distribution of grid transparency using an arbitrary unit as a function of radius in another arbitrary conventional grid design. The scattered data points in FIG. 3 are associated with boundaries where the patterns do not match and holes have been manually adjusted.

SUMMARY

Disclosed is a design process for varying hole locations or sizes in an ion beam grid including identifying a control grid to be modified; obtaining a hole location and/or hole size change factor for the grid pattern; and, using the change factor to generate a new grid pattern, which may also be referred to as "scaling" the grid transparency. Further disclosed are grids generated using the described design patterns.

BRIEF DESCRIPTION OF THE DRAWINGS

In the drawings:
FIG. 6, which includes sub-part

DETAILED DESCRIPTION

An objective design process for varying hole locations and the hole-to-hole distances therebetween in an ion beam grid has been developed using a mathematical model to change grid transparency, also known as grid open area fraction. The new technique or techniques hereof do not require discrete zones (such as those shown in FIGS. 1 and 2) and, therefore, may substantially eliminate tedious and subjective manipulation of moving grid holes at boundaries of the zones. Rather, this design process provides for substantially continuously varying by "stretching" and/or "shrinking" the hole-to-hole distances to continuously or substantially continuously vary the grid ion transparency (open area) to compensate for plasma non-uniformities or beam non-uniformities due to other causes. In addition to the process, also thus developed are new grids manufactured with a substantially continuously varying transparency based on a design process hereof. The result of either or both will typically be greater control of ion beam uniformity. Though the discussion here references beam grids, for example for ion sources, it applies generally to any charged particle broad beam source including either positive or negative ion beam sources or electron sources.

This mathematically based process for developing grid transparencies may solve the shortcomings of current grid pattern design techniques, which use discrete sections or zones of established hole-to-hole distances or hole diameters, by instead using a substantially smooth, substantially continuous variation of hole-to-hole distances or substantially continuously changing grid hole diameters. Exemplar design procedures according hereto are thus described in the following procedures.

Figure 4:
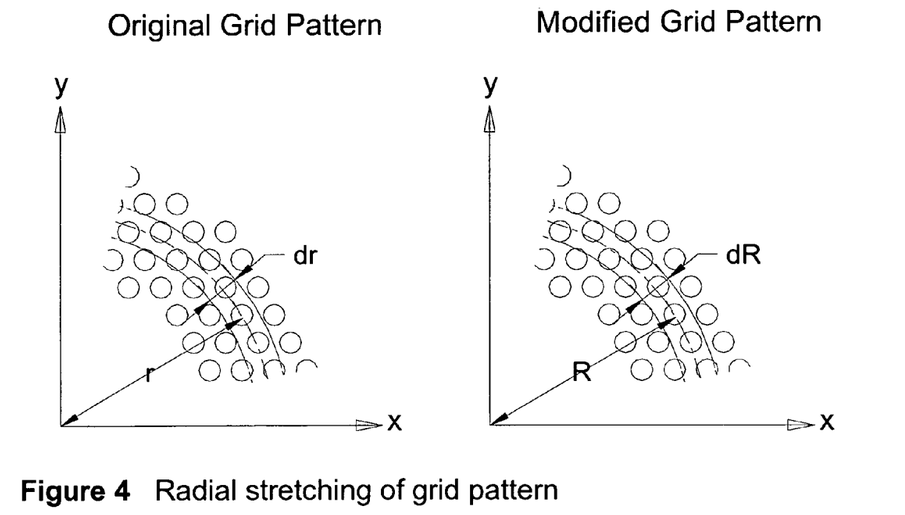
FIG. 4 presents a pair of enlarged portions of a schematic grid pattern.

A first general technique starts with an initial (original or control) grid pattern to be modified. Then, in a first alternative implementation, as shown in FIG. 4, radial coordinates of the initial pattern hole locations may be changed from r to R. However, when doing so, there should be the same number of grid holes in the range of (r−dr/2, r+dr/2) in the original pattern and in the range of (R−dR/2, R+dR/2) in the modified pattern. Assuming the grid transparency of the original and modified grid patterns may be given as functions of radius as f(r) and F(R), respectively, $$f(r) \times 2\pi r \times dr = F(R) \times 2\pi R \times dR$$

$$\therefore \frac{dR}{dr} = \frac{r \times f(r)}{R \times F(R)}.$$

By solving this differential equation for the grid hole location change factor R(r) with a boundary condition of R(r=$r_0$)=$r_0$, a new grid pattern can be obtained which achieves a desired or desirable grid transparency profile F(R). Hereafter, the grid hole location change factor may alternatively be referred to as a location change factor or simply as a change factor.

Figure 5:
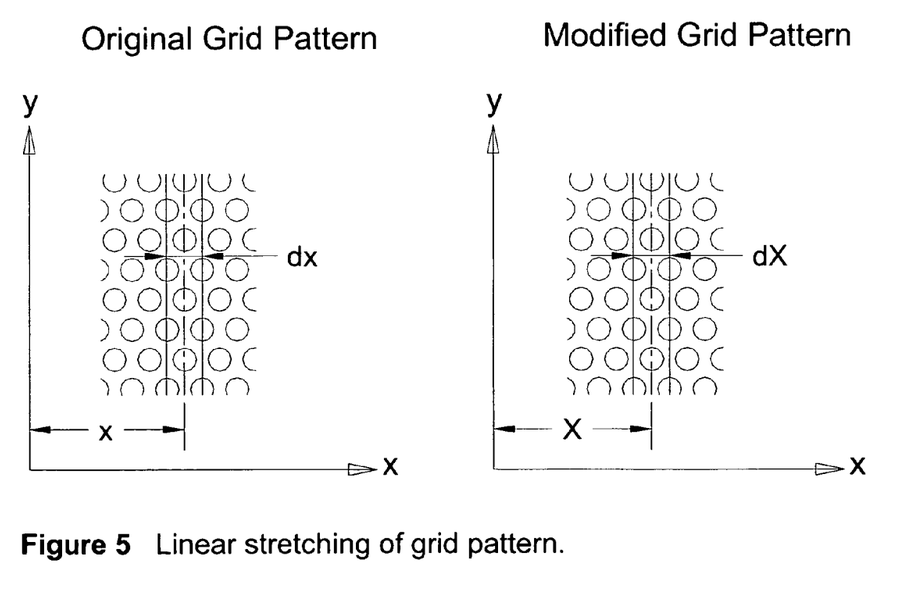
FIG. 5 presents a pair of enlarged portions of an alternative schematic grid pattern.

In an alternative second implementation, the technique may also start with an initial (original or control) grid pattern to be modified. Then, as shown in FIG. 5, one of the Cartesian coordinates of each of several initial pattern hole locations may be changed from x to X, and as before, there should be the same number of grid holes in the range of (x−dx/2, x+dx/2) in the original pattern and in the range of (X−dX/2, X+dX/2) in the modified pattern. Assuming the grid transparency of the original and modified grid patterns are given as functions of Cartesian distance as h(x) and H(X), respectively, $$h(x) \times dx = H(X) \times dX$$

$$\therefore \frac{dX}{dx} = \frac{h(x)}{H(X)}.$$

Then, by solving this differential equation for a location change factor X(x) with a arbitrary boundary condition (such as X(x)=0), a new grid pattern can be obtained, which achieves the desired grid transparency profile H(X). An example of an application of the general process hereof is described in relation to and shown in FIG. 10 (see description below) in flow chart form for both radial and linear pattern modifications. Though not described in detail here, a similar process could be used for azimuthal pattern modifications, where ⊖ is the azimuthal coordinate in a polar coordinate system and a comparable differential equation is solved for a location change factor ⊖(θ) with appropriate boundary conditions.

Various means may be used in solving differential equations such as these, as for example, may be found in commercially available software products such as MathCad or Mathematica. As another example, Microsoft Excel files have also been used for this purpose. A fourth ($4^{th}$) order Runge-Kutta routine is one example that may be used for solution of the differential equation, among other forward-marching techniques of any orders (such as the so-called Euler method if it is 1st order, e.g.). For the radial method, by providing f(r) and F(R), the user would then be able to obtain a location change factor R(r), which is used to radially move the grid hole locations from the original design position to obtain the modified hole pattern. Similarly, by providing h(x) and H(X), the user would then be able to obtain a location change factor X(x), which is used to linearly move the grid hole locations from the original design position to obtain the modified hole pattern for linear stretching/shrinking in Cartesian coordinate systems. Similarly, by providing p(θ) and P(⊖), the user would then be able to obtain a location change factor ⊖(θ), which is used to azimuthally move the grid hole locations from the original design position to obtain the modified hole pattern in polar coordinate systems.

Figure 11:
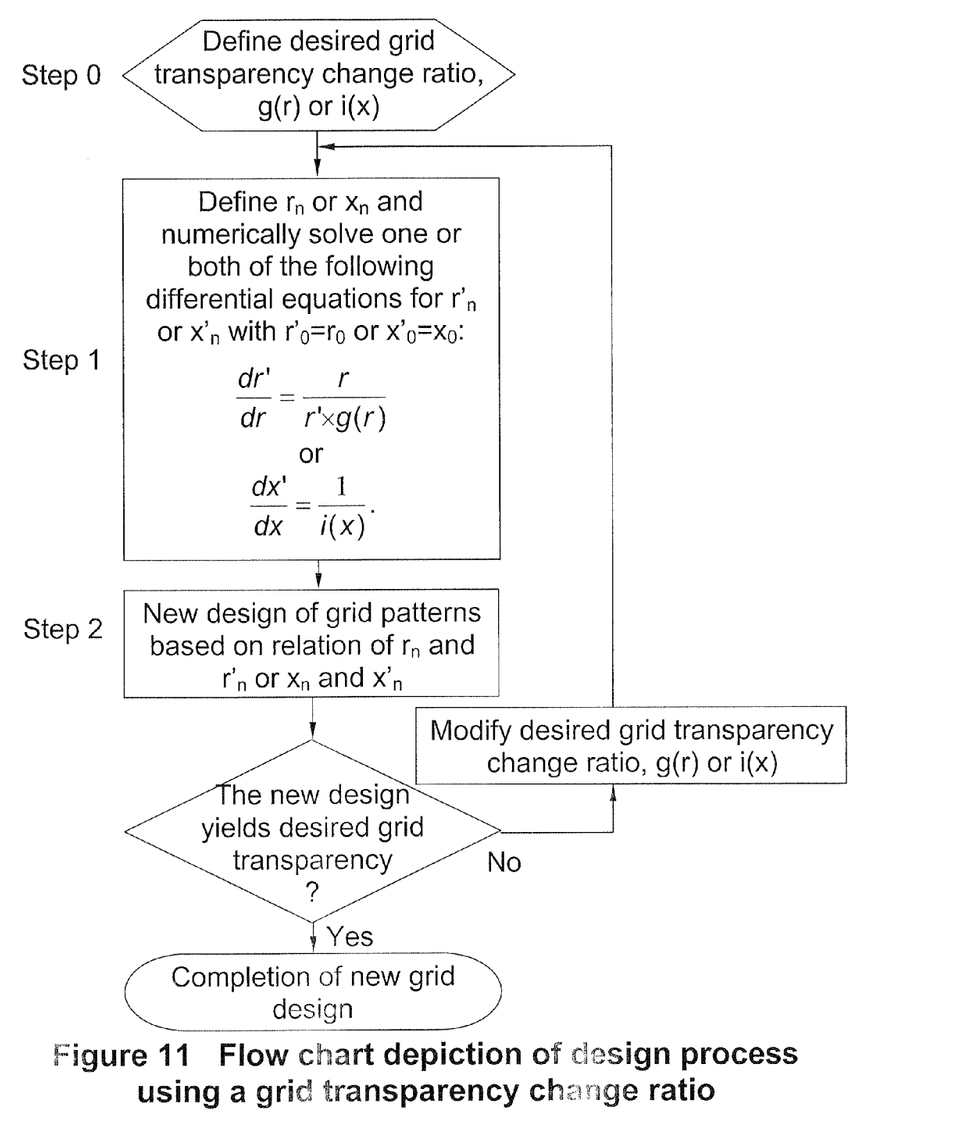

Viewed in a different light, a procedure hereof may be described as follows using a ratio of grid transparency modification as an approximation. Step 0: Defining a desired ratio of grid transparency by this modification (i(x) in a Cartesian system or g(r) in a 2D radial system) to achieve a better ion beam density uniformity profile. Such profiles can be determined based on experiments or other methods. This may first involve identifying a control grid which may be sought to be modified. Then, Step 1: Based on the desired modification, a grid transparency change ratio may be approximated by solving differential equations, which have different formats depending on the direction of modification. In a Cartesian system, it is $$\frac{dx'}{dx} = \frac{1}{i(x)},$$

where the grid transparency change ratio i(x)=H(x)/h(x) is an approximation to H(X)/h(x) and x'(x) yields an approximation of location change factor X(x). In a 2D radial system, it is $$\frac{dr'}{dr} = \frac{r}{r' \times g(r)},$$

where the grid transparency change ratio g(r)=F(r)/f(r) is an approximation to F(R)/f(r) and r'(r) yields an approximation of location change factor R(r). Next, Step 2: Applying the solution of the above differential equation to the control grid hole pattern, a new grid pattern is obtained. As an optional further step, Step 3: If ion beam density profiles obtained with the new grid pattern do not provide the preferred level of uniformity, then, the above steps 1-2 (either alternatively or in addition to steps 0-2) with adjustment of the desired modification in grid transparency may be iterated. A flow of iterative steps according hereto is shown in and described relative to FIG. 11 (see description below). Again, a similar process could be used for azimuthal pattern modification.

This can be depicted somewhat graphically as shown in the four parts of FIG. 6 using a radial example. The first graph of FIG. 6, namely FIG. 6A, shows a non-uniform ion beam density profile as such might appear to a substrate of an approximate ten inch width. Note the mirroring left to right (about a central vertical axis) as might be expected from a circular grid as shown for example in FIG. 1. Note also that as might be expected, the density generally declines near the far edges, although a higher than normalized density may occur near or nearer the center. In contrast, the preferred uniform normalized density should more preferably appear as a flat line such as that shown in the third graph of FIG. 6, namely, FIG. 6C. Thus, the first step as set forth herein is to identify the grid wanting an improvement toward uniformity. The grid which produced the profile of FIG. 6A may be just such a grid. Then, the next step is to calculate the desired grid transparency change ratio. This change ratio is approximated by calculating a ratio between the desired and actual normalized beam current density at each radial position. The second plot of FIG. 6, namely, FIG. 6B, presents a graphical representation of such a grid transparency change ratio for the right half of the FIG. 6A graphical profile. Note, the top to bottom horizontal mirror image effect of the FIG. 6B plot relative to the right side portion of the FIG. 6A graph. Conceptually, the grid transparency change ratio plot of FIG. 6B may also represent an inverse relationship to the values of the initial values of the FIG. 6A graph. As such, the product of the initial values with the inverse values would approach if not equal the normalized value of the FIG. 6C graph. The differential equation solution r'(r) for this radial example is shown graphically as a difference of r'(r) from r in FIG. 6D. It represents a continuously varying location change factor that can be applied to the radial location of each hole in the original design to provide a new design, which will have improved uniformity performance approaching the ideal shown in FIG. 6C. Note that, while the holes at the edge move significantly (up to in this particular example about 2 mm), adjacent holes also move a similar amount so that the distance between adjacent holes changes only slightly. Therefore, in the example discussed above, the radial location of every hole in the original discrete zoned pattern was moved, i.e., "stretched/shrunk," in a manner such that the new hole-to-hole spacing continuously or substantially continuously varied from the original spacing, resulting in a new pattern that, though perhaps still containing discrete zones, may better satisfy the improved uniformity criteria.

Figure 7:
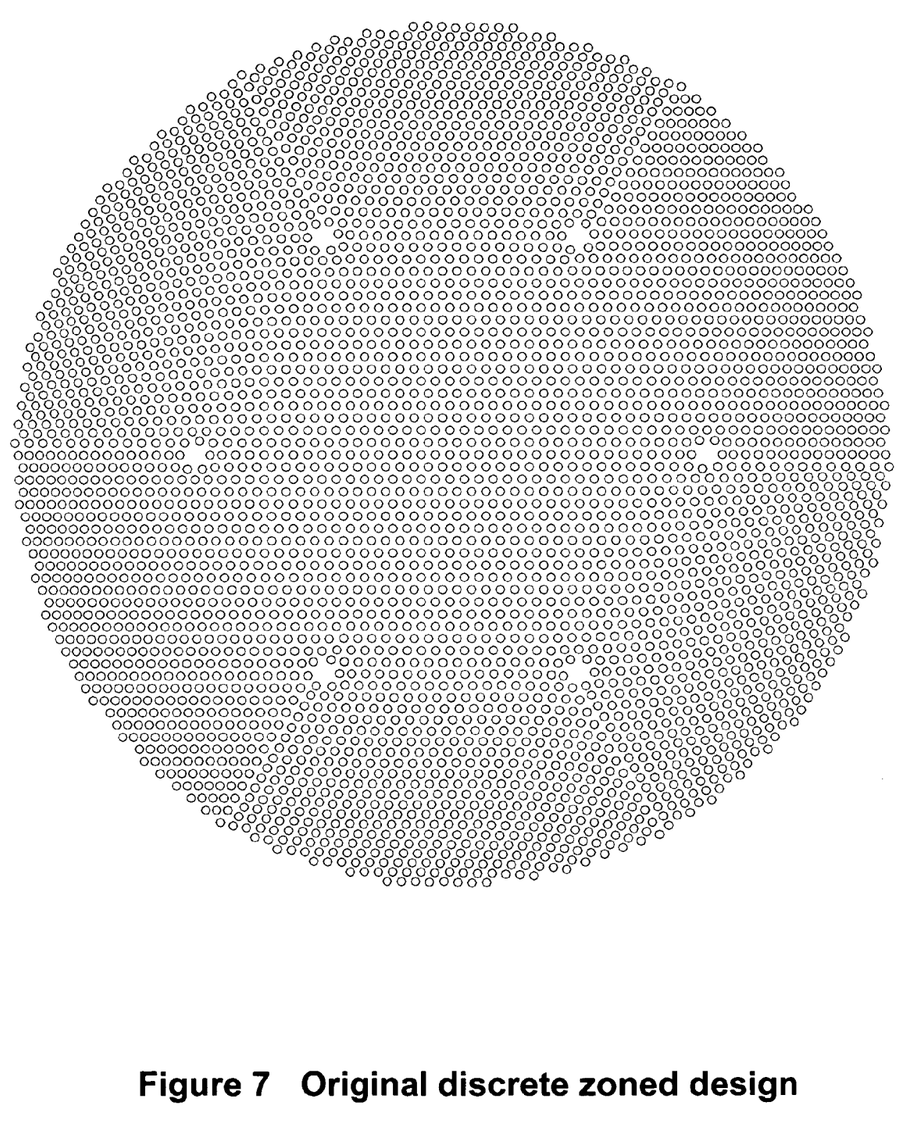
FIG. 7 is another schematic plan view of a conventional ion beam grid pattern.
Figure 8:
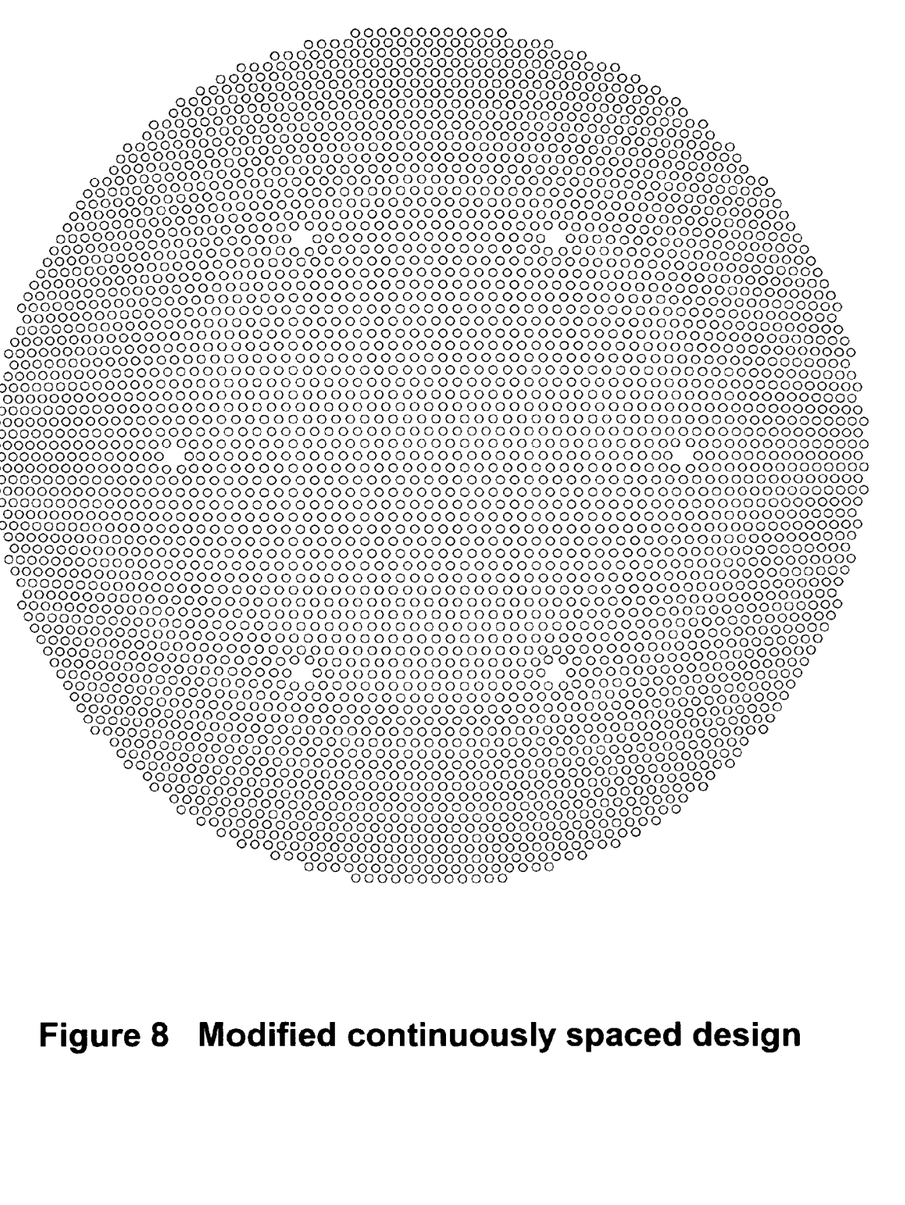
FIG. 8 is a schematic plan view of an ion beam grid pattern generated hereby.

In addition to using the technique for improving the performance of an initial discrete zoned pattern, the technique can also be used for design of a new pattern with continuously varying hole spacing. In one of the examples for this case, a continuously varying grid transparency change ratio g(r) or i(x) may be used to approximate a discrete zoned design and input to the differential equation. The resulting location change factor solution r'(r) (approximation of R(r)) or x'(x) (approximation of X(x)) may functionally duplicate yet "smooth" the original discrete zoned design. A sample of such a discrete zoned pattern is shown in FIG. 7. In FIG. 7, the irregularity of the hole pattern can easily be seen in areas extending radially outwardly from the six areas of absent holes. By application of the process described here, a smooth, continuously varying adjustment of grid hole locations can then provide the smooth pattern of the grid as shown for example in FIG. 8. The result may then be greater control of ion beam uniformity because the discontinuities associated with the discrete zones may thus have been eliminated.

Thus, a mathematical model was developed to continuously or substantially continuously scale a grid pattern design to achieve a desired improved ion beam uniformity. A few grid sets were designed using this model and etch rate measurements showed improvement of ion beam uniformity when they were used in ion beam etch applications. The technique has been applied to ion source grid design, and tests indicate predictable improvement of grid performance in terms of ion beam current density uniformity, and improved etch rate distributions. Note that in some cases the initial designs were discrete zoned control designs which were "stretched" continuously to compensate for non-uniformities found in experimentally measured etch profiles. Moreover, this design process has been iterated in series with a ray-tracing model to provide a continuously varying transparency design. This iteration process was used to functionally duplicate yet "smooth" the original discrete zoned design. The intent may thus be to provide a continuously varying transparency design without any discrete zones but that would functionally duplicate the original discrete zoned design as closely as possible with still greater etch uniformity. This continuously varying baseline design may then serve as a starting point for further experimentally based iterations to optimize grid performance at specific operating conditions relevant to a particular application.

It has thus been found that in general, continuously or substantially continuously varying transparency designs may be desirable. Given a measured plasma density radial profile or a radial beam current density as a starting point, this technique is capable of providing such designs.

Yet another implementation of varying grid transparency designs using change factors such as described herein may be to substantially continuously change hole diameters. A process for establishing a design with substantially continuously varying hole diameters may be implemented in the following manner. When an original grid design having hole diameters, d, as a function of their radial coordinates, r, as d(r), is established and a desired modified grid design of a desired grid transparency with a grid transparency change ratio j(r) is known; then, a modified grid design should have hole diameters of:

$$d'(r)=d(r)\times\sqrt{j(r)}$$

where d'(r) is a new diameter, which is designated hereafter as a hole diameter change factor or, alternatively, may simply be referred to as a change factor. Alternatively, if the hole diameters and desired grid transparency change ratio are given in a Cartesian system as d(x) and k(x), respectively, then the modified grid design diameters would be shown by:

$$d'(x)=d(x)\times\sqrt{k(x)}$$

where d'(x) is a new diameter, which is also designated hereafter as a hole diameter change factor or simply as a change factor.

Moreover, techniques of varying hole positions and hole diameters may feasibly be combined together. An overall desired grid transparency change ratio, l(x) or m(r), can be achieved by combining a desired grid transparency change ratio, k(x) or j(r), which may be achieved by varying hole diameters and a different desired grid transparency change ratio, i(x) or g(r), which may be achieved by varying hole locations where:

$$l(x)=i(x)\times k(x),$$

or $$m(r)=g(r)\times j(r).$$

For each overall change ratio, l(x) or m(r), a designer may arbitrarily partition grid transparency change ratios (i(x) and k(x), or g(r) and j(r)) as long as the above equations are satisfied. Then, each grid transparency change ratio can be used to solve for a location change factor, x'(x) or r'(r), and a diameter change factor, d'(x) or d'(r).

Figure 9:
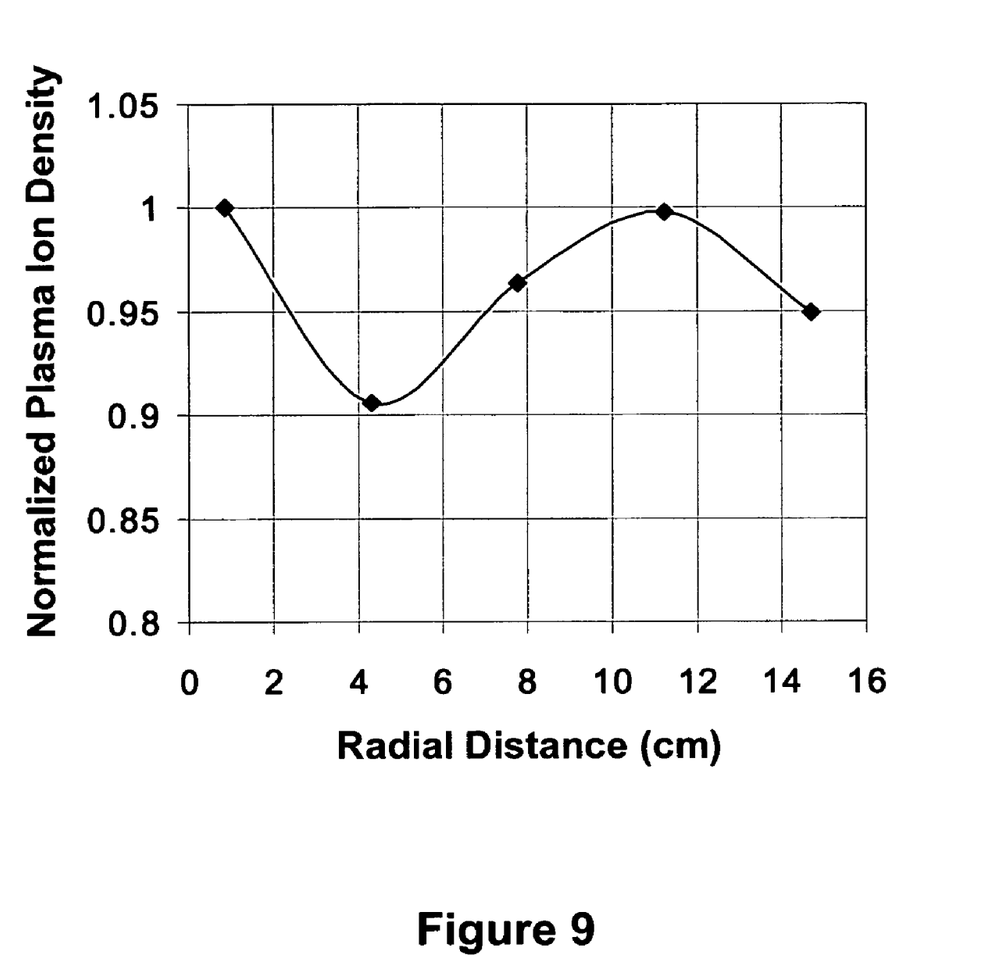
FIG. 9 is a plot of a radial plasma ion density profile which may be used herewith.

While the various implementations described above used as a starting point an original or control grid pattern together with the corresponding measured beam current density profile from the extracted beam to determine a grid transparency change ratio for a new grid, it is also possible to start with either a measured or a theoretically modeled plasma ion density profile. This could be useful for designing the first iteration grids for a new device based on either a theoretical model for the discharge or measurements of ion plasma density in a prototype chamber. Here the distinction is made between the plasma ion density profile associated with the ion source that supplies ions to the grid system and the density profile of the ion beam extracted by the grids from that source. An example of such a radial ion density profile is shown in FIG. 9. In this case, one might begin the process using as a control grid pattern one with a constant hole spacing and use as f(r) the function representing the plasma ion density profile or any other initial starting point.

Figure 10:
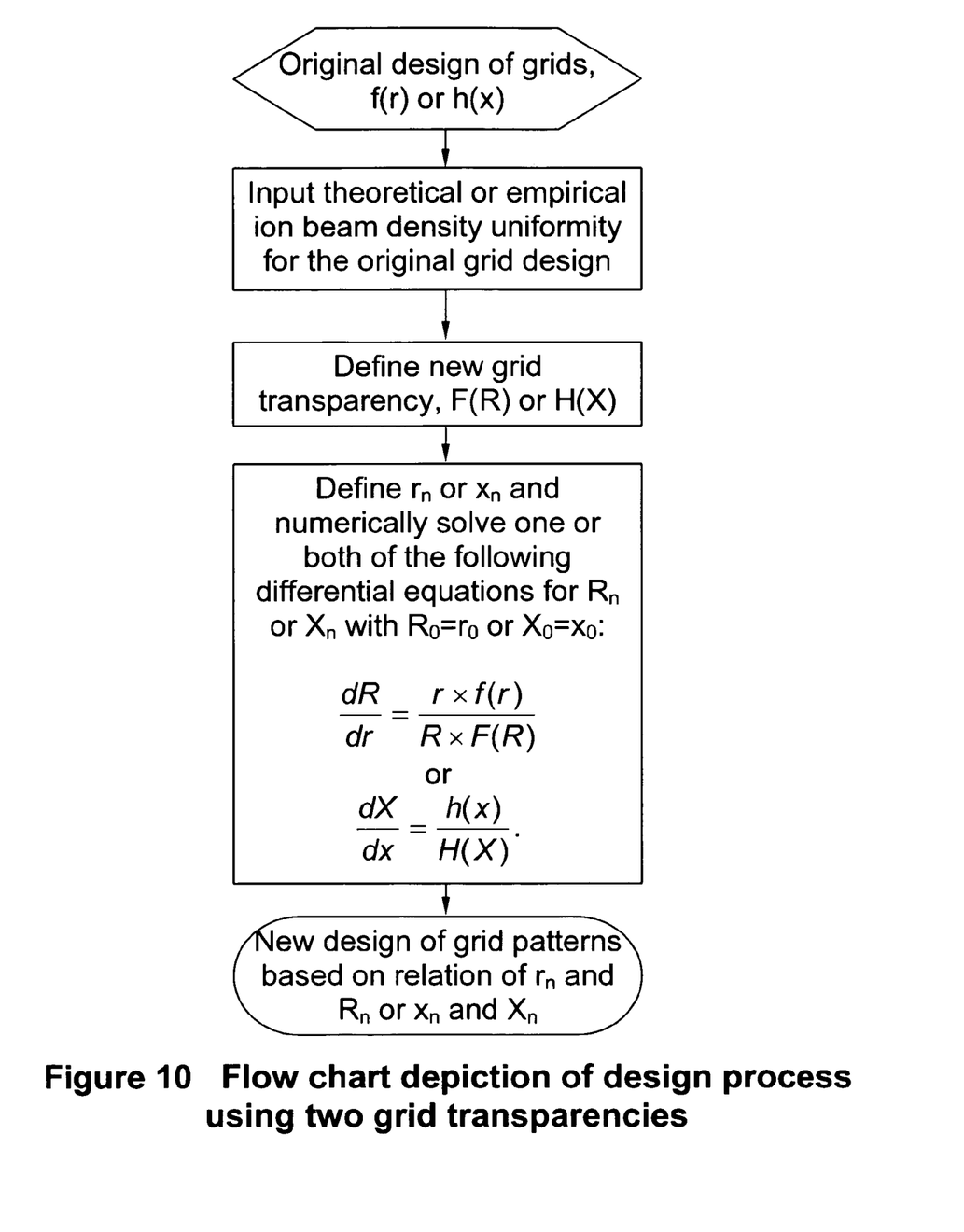
FIG. 10 is a flow chart depiction of a design process hereof; and,
FIG. 11 is another flow chart depiction of a design process hereof.

A further detailed process herefor may be as follows, and as shown in FIG. 10. In particular, a first step may generally involve the establishment of a control grid pattern whether of a previously calculated or previously manufactured grid, which grid transparency is given as f(r) or h(x). Then, after the designer specifies a new grid transparency F(R) or H(X), the grid hole location change factor may be obtained by solving one or more differential equations. An example of solving the differential equation(s) may include a usage of a 4th order Runge Kutta method. For example, when a radial differential equation of $$\frac{dR}{dr} = \frac{r \times f(r)}{R \times F(R)}$$

is solved with this method where locations and boundary conditions ($r_n$(n=0,1,2,...) and $R_0=r_0$) are defined, inter alia (for example, various design constraints such as grid pattern overall size and/or minimum thickness between holes), $R_{n+1}$ would be obtained using $r_n$, $R_n$, f(r), F(R), and $\Delta r(=r_{n+1}-r_n)$ according to the following equations:

$$k_1 = \Delta r \times \frac{r_n \times f(r_n)}{R_n \times F(R_n)},$$

$$k_2 = \Delta r \times \frac{\left(r_n + \frac{\Delta r}{2}\right) \times f\left(r_n + \frac{\Delta r}{2}\right)}{\left(R_n + \frac{k_1}{2}\right) \times F\left(R_n + \frac{k_1}{2}\right)},$$

$$k_3 = \Delta r \times \frac{\left(r_n + \frac{\Delta r}{2}\right) \times f\left(r_n + \frac{\Delta r}{2}\right)}{\left(R_n + \frac{k_2}{2}\right) \times F\left(R_n + \frac{k_2}{2}\right)},$$

$$k_4 = \Delta r \times \frac{(r_n + \Delta r) \times f(r_n + \Delta r)}{(R_n + k_3) \times F(R_n + k_3)},$$

$$R_{n+1} = R_n + \frac{k_1 + k_2 \times 2 + k_3 \times 2 + k_4}{6}.$$

The solution to the differential equation may then give the new location for the hole as a grid hole location change factor in the form of arrays of $r_n$ and $R_n$. Note, tables or other utilities may be used for developing and/or tracking the modified locations relative to the original locations. This method can be used for radial and/or linear coordinate systems as indicated in FIG. 10.

Figure 6A:
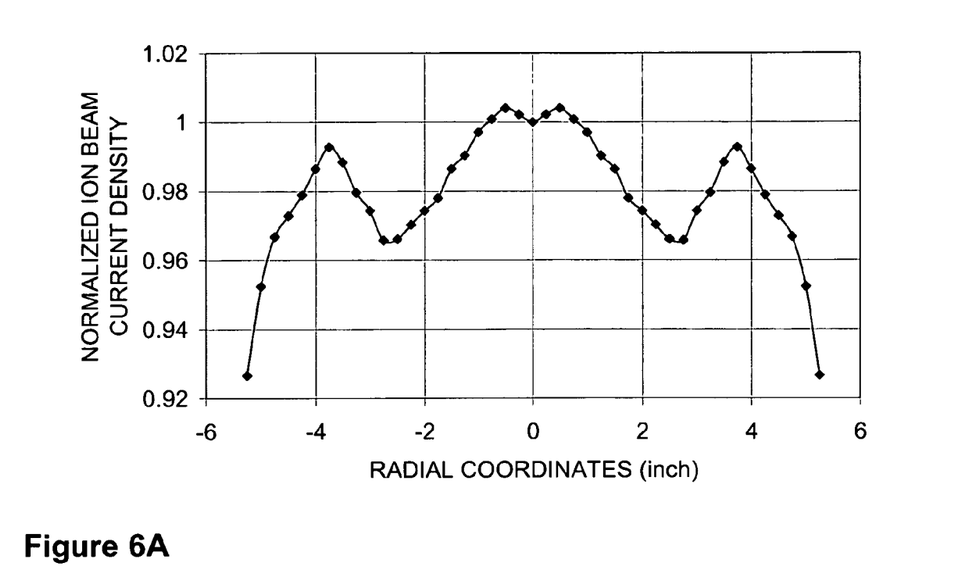
FIGS. 6A, 6B, 6C and 6D, is a collection of graphs illustrating a process hereof.
Figure 6B:
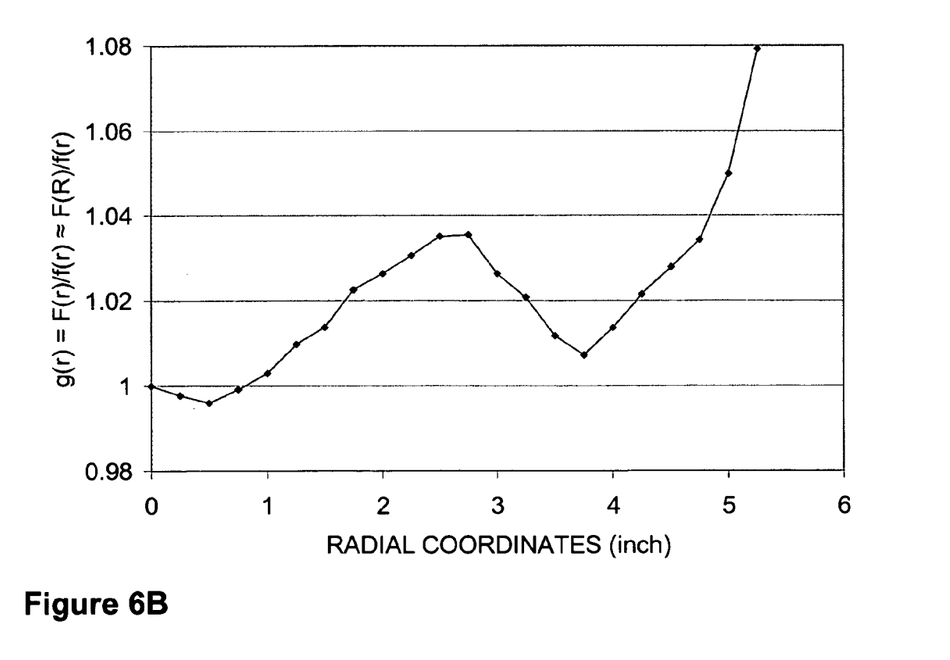
Figure 6C:
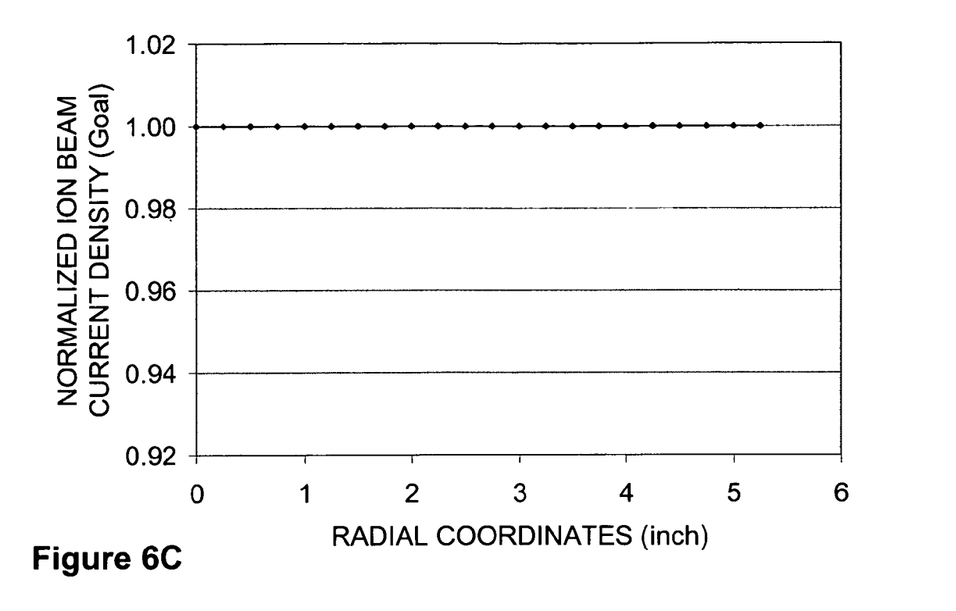
Figure 6D:
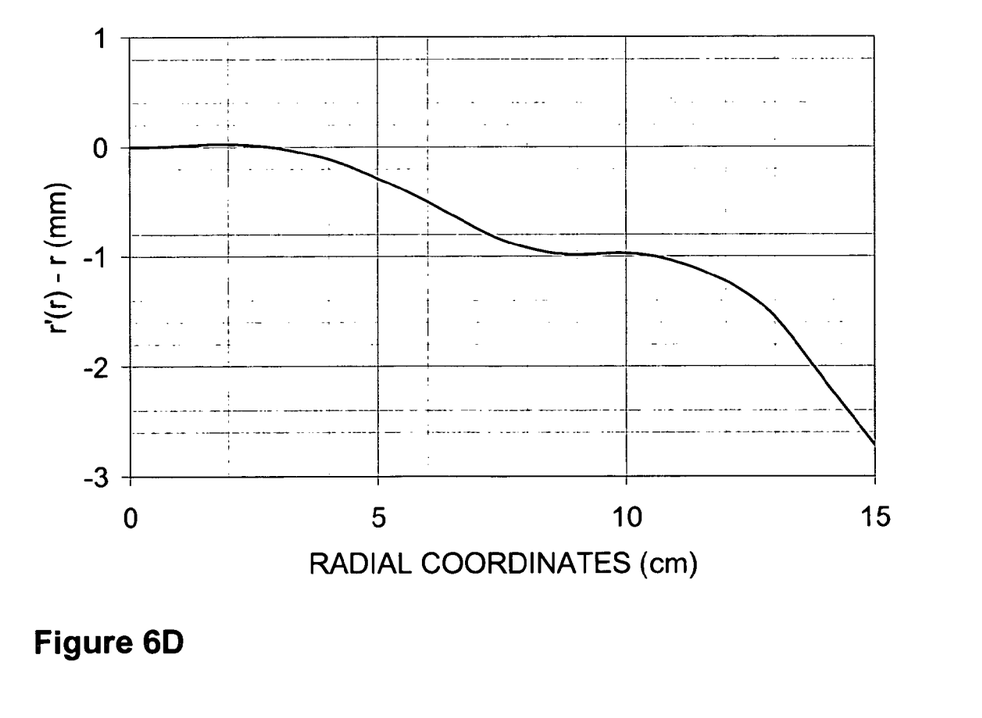

The alternate implementation shown in FIG. 11 start with approximated grid transparency change ratio, g(r) or i(x). In this implementation example, the initial operation or Step 0, may involve defining a desired ratio of grid transparencies as g(r) (which may be obtained as F(R=r)/f(r)) or i(x) (which may be obtained as H(X=x)/h(x)). Such an example is shown in FIG. 6B. Then, in a further operation, here, Step 1, a combination of a definition and calculation with a subsequent determination may be performed. First, this may involve a defining of $r_n$ or $x_n$(n=0,1,2,...) with a setting of $r'_0=r_0$ or $x'_0=x_0$ and solving one or both of the following differential equations:

$$\frac{dr'}{dr} = \frac{r}{R \times g(r)}, \text{ or}$$

$$\frac{dx'}{dx} = \frac{1}{i(x)}$$

which gives a grid hole location change factor in the form of arrays of $r_n$ and $r'_n$ or that of $x_n$ and $x'_n$. Then, proceeding to Step 2, a grid may be manufactured with a hole pattern based on the relations of $r_n$ and $r'_n$ or of $x_n$ and $x'_n$. After this Step 2, then a further determination of whether the new design yields a desired grid transparency can be made, where if so the process of FIG. 11 is complete. However, if not, then an iteration of both Steps 1 and 2 may be re-done. If necessary, a modification of a desired grid transparency change ratio, g(r) or i(x), based on a grid transparency may be obtained relative to and/or from a previous iteration.

Though many of the examples above mention ion beam grids and ion beam sources, the design processes and grids manufactured based thereon could apply generally to any charged particle broad beam source including either positive or negative ion beam sources or electron sources. In such cases, the spatial functions of interest would be for example those such as the upstream negative ion density (and/or arrival rate) profiles or electron density (and/or arrival rate) profiles and the corresponding downstream charged particle beam current density profiles, where upstream and downstream are defined relative to the extraction grid. Likewise, though various forms of electrical discharge sources, for example DC or RF excited discharges, are common as plasma sources for ion beam extraction, the design processes described here and the grids manufactured thereon are expected to be generally applicable to charged particle beams extracted from plasmas generated by any one of numerous alternate means, for example, microwave plasmas, standing wave sheet plasmas, laser stimulated plasmas, surface contact or emission plasmas, and from various non-plasma, single charge species field and surface emission devices, inter alia.

The above specification, examples and data provide a description of the process and structure and use of exemplary embodiments of the invention. However, other implementations are also contemplated within the scope of the present invention, including without limitation methods of providing and/or grids having holes of different shapes, sizes, and locations than those shown and/or described. In addition, while the description has described exemplary process and grids, other processes and grids may be employed within the scope of the invention. Since many implementations can be made and/or used without departing from the spirit and scope of the invention, the invention resides in the claims hereinafter appended.

What is claimed is:

1. A design process for creating a modified pattern of holes for a beam grid comprising:

identifying an initial pattern of holes for the beam grid to be modified;

obtaining a change factor for the initial pattern of holes for the beam grid;

using the change factor to generate the modified pattern of holes for the beam grid based on the initial pattern of holes.

2. A design process according to claim 1 wherein the change factor is one or both of a hole location change factor or a hole diameter change factor.

3. A design process according to claim 1 wherein the obtaining operation includes solving a differential equation.

4. A design process according to claim 1 wherein the obtaining operation includes solving one or both of the following differential equations:

$$\frac{dR}{dr} = \frac{r \times f(r)}{R \times F(R)}, \text{ wherein}$$

r represents radial coordinates of the initial pattern hole locations, f(r) represents grid transparency of the initial pattern hole locations, F(R) represents grid transparency of the modified pattern hole locations, and R represents the change factor for generating the modified pattern of holes $$\frac{dX}{dx} = \frac{h(x)}{H(X)}, \text{ wherein}$$

x represents Cartesian coordinates of the initial pattern hole locations, h(x) represents grid transparency of the initial pattern hole locations, H(X) represents grid transparency of the modified pattern hole locations, and X represents the change factor for generating the modified pattern of holes.

5. A design process according to claim 4 wherein the obtaining operation includes providing one or more of f(r) and F(R), and using the one or both differential equations to obtain R, which is used to radially re-locate hole locations of the initial pattern of holes to obtain the modified pattern of holes; and h(x) and H(X), and using the one or more differential equations to obtain X, which is used to linearly re-locate hole locations of the initial pattern of holes to obtain the modified pattern of holes.

6. A design process according to claim 4 wherein one or both of the differential equations are solved using a forward-marching numerical technique.

7. A design process according to claim 1 wherein the obtaining operation includes solving one or more of the following differential equations using a 4th order Runge-Kutta method:

$$\frac{dR}{dr} = \frac{r \times f(r)}{R \times F(R)}, \text{ wherein}$$

r represents radial coordinates of the initial pattern hole locations, f(r) represents grid transparency of the initial pattern hole locations, F(R) represents grid transparency of the modified pattern hole locations, and R represents the change factor for generating the modified pattern of holes;

or, $$\frac{dX}{dx} = \frac{h(x)}{H(X)}, \text{ wherein}$$

x represents Cartesian coordinates of the initial pattern hole locations, h(x) represents grid transparency of the initial pattern hole locations, H(X) represents grid transparency of the modified pattern hole locations, and X represents the change factor for generating the modified pattern of holes;

or, $$\frac{dr'}{dr} = \frac{r}{r' \times g(r)}, \text{ wherein}$$

g(r) represents a desired ratio of grid transparency in a radial system, and r' represents an approximation of the change factor for generating the modified pattern of holes;

or $$\frac{dx'}{dx} = \frac{1}{i(x)}, \text{ wherein}$$

i(x) represents a desired ratio of grid transparency in a Cartesian system, and x' represents an approximation of the change factor for generating the modified pattern of holes.

8. A design process according to claim 1 wherein the obtaining a operation includes solving one or both of the following differential equations:

$$\frac{dr'}{dr} = \frac{r}{r' \times g(r)}, \text{ wherein}$$

r represents radial coordinates of the initial pattern hole locations, g(r) represents a desired ratio of grid transparency in a radial system, and r' represents an approximation of the change factor for generating the modified pattern of holes;

or $$\frac{dx'}{dx} = \frac{1}{i(x)}, \text{ wherein}$$

x represents Cartesian coordinates of the initial pattern hole locations, i(x) represents a desired ratio of grid transparency in a Cartesian system, and x' represents an approximation of the change factor for generating the modified pattern of holes.

9. A design process according to claim 8 wherein the obtaining operation includes providing one or more of
   g(r) and using the one or both differential equations to obtain r', which is used to radially re-locate hole locations of the initial pattern of holes to obtain the modified pattern of holes; and
   i(x) and using the one or both differential equations to obtain x', which is used to linearly re-locate hole locations of the initial pattern of holes to obtain the modified pattern of holes.

10. A design process according to claim 8 wherein one or both of the differential equations are solved using a forward-marching numerical technique.

11. A design process according to claim 1, wherein one or more of the identifying, obtaining, and using operations are iterated to generate the modified pattern of holes.

12. A design process according to claim 1 wherein the beam grid substantially continuously varies in transparency.

13. A beam grid generated by the design process of claim 1.

14. A design process according to claim 1 wherein the change factor defines an array of individual hole locations in the modified pattern of holes relative to an array of individual hole locations in the initial pattern of holes.

15. The design process of claim 1 wherein the change factor is further used to vary hole locations in the beam grid to change transparency of the beam grid.

16. A beam grid having a modified pattern of holes designed by:
   identifying an initial pattern of holes for the beam grid to be modified;
   obtaining a change factor for the initial pattern of holes for the beam grid;
   using the change factor to generate the modified pattern of holes for the beam grid based on the initial pattern of holes.

17. A beam grid according to claim 16 wherein the change factor is one or both of a hole location change factor or a hole diameter change factor.

18. A beam grid according to claim 16 wherein the change factor is obtained from the solution of a differential equation.

19. A beam grid according to claim 16 wherein the change factor is obtained from a solution of one or both of the following differential equations:

$$\frac{dR}{dr} = \frac{r \times f(r)}{R \times F(R)}, \text{ wherein}$$

r represents radial coordinates of the initial pattern hole locations, f(r) represents grid transparency of the initial pattern hole locations, F(R) represents grid transparency of the modified pattern hole locations, and R represents the change factor for generating the modified pattern of holes;

or, $$\frac{dX}{dx} = \frac{h(x)}{H(X)}, \text{ wherein}$$

x represents Cartesian coordinates of the initial pattern hole locations, h(x) represents grid transparency of the initial pattern hole locations, H(X) represents grid transparency of the modified pattern hole locations, and X represents the change factor for generating the modified pattern of holes.

20. A beam grid according to claim 19 wherein the one or both differential equations are provided with one or more of
   f(r) and F(R), and using one or both differential equations to obtain R, which characterizes radial hole locations of the modified pattern of holes compared to the initial pattern of holes; and
   h(x) and H(X), and using one or more differential equations to obtain X, which characterizes linear hole locations of the modified pattern of holes compared to the initial pattern of holes.

21. A beam grid according to claim 19 wherein one or both of the differential equations are solved using a forward-marching numerical technique.

22. A beam grid according to claim 16 wherein the change factor is obtained from a solution of one or more of the following differential equations using a 4th order Runge-Kutta method:

$$\frac{dR}{dr} = \frac{r \times f(r)}{R \times F(R)}, \text{ wherein}$$

r represents radial coordinates of the initial pattern hole locations, f(r) represents grid transparency of the initial pattern hole locations, F(R) represents grid transparency of the modified pattern hole locations, and R represents the change factor for generating the modified pattern of holes;

or, $$\frac{dX}{dx} = \frac{h(x)}{H(X)}, \text{ wherein}$$

x represents Cartesian coordinates of the initial pattern hole locations, h(x) represents grid transparency of the initial pattern hole locations, H(X) represents grid transparency of the modified pattern hole locations, and X represents the change factor for generating the modified pattern of holes;

or, $$\frac{dr'}{dr} = \frac{r}{r' \times g(r)}, \text{ wherein}$$

g(r) represents a desired ratio of grid transparency in a radial system r' represents an approximation of the change factor for generating the modified pattern of holes;

or $$\frac{dx'}{dx} = \frac{1}{i(x)}, \text{ wherein}$$

i(x) represents a desired ratio of grid transparency in a Cartesian system x' represents an approximation of the change factor for generating the modified pattern of holes.

23. A beam grid according to claim 16 wherein the change factor is obtained from the solution of one or both of the following differential equations:

$$\frac{dr'}{dr} = \frac{r}{r' \times g(r)}, \text{ wherein}$$

r represents radial coordinates of the initial pattern hole locations, g(r) represents a desired ratio of grid transparency in a radial system, and r' represents an approximation of the change factor for generating the modified pattern of holes; or $$\frac{dx'}{dx} = \frac{1}{i(x)}, \text{ wherein}$$

x represents Cartesian coordinates of the initial pattern hole locations and i(x) represents a desired ratio of grid transparency in a Cartesian system, and x' represents an approximation of the change factor for generating the modified pattern of holes.

24. A beam grid according to claim 23 wherein the one or more differential equations are provided with one or more of
 g(r) and using the one or both differential equations to obtain r', which characterizes radial locations of the modified pattern of holes compared to the initial pattern of holes; and
 i(x) and using the one or both differential equations to obtain x', which characterizes linear locations of the modified pattern of holes compared to the initial pattern of holes.

25. A beam grid according to claim 23 wherein one or both of the differential equations are solved using a forward-marching numerical technique.

26. A beam grid according to claim 16 wherein the identifying, obtaining, and using operations are iterated to generate the modified pattern of holes.

27. A beam grid according to claim 16 wherein the modified pattern of holes varies from the initial pattern of holes by one or both of hole size and hole location.

28. A beam grid according to claim 16 that substantially continuously varies in transparency.

29. A beam grid according to claim 16 wherein the change factor defines an array of individual hole locations in the modified pattern of holes relative to an array of individual hole locations in the initial pattern of holes.

30. The beam grid of claim 16 wherein the change factor is further used to vary hole locations in the beam grid to change transparency of the beam grid.

\* \* \* \* \*

UNITED STATES PATENT AND TRADEMARK OFFICE
CERTIFICATE OF CORRECTION

PATENT NO. : 7,716,021 B2  Page 1 of 1
APPLICATION NO. : 11/395354
DATED : May 11, 2010
INVENTOR(S) : Ikuya Kameyama and Daniel E. Siegfried It is certified that error appears in the above-identified patent and that said Letters Patent is hereby corrected as shown below:

Drawing Sheet 1 of 10, Figure 2, delete two instances of "Irreguralities" and insert two instances of --Irregularities--, therefor.

Drawing Sheet 1 of 10, Figure 2, delete "Asimuhtal" and insert --Azimuthal--, therefor.

Column 9, line 30 (approximately), in claim 4, below "holes" insert --or,--.

Signed and Sealed this

Seventeenth Day of August, 2010

David J. Kappos
*Director of the United States Patent and Trademark Office*